(12) United States Patent
Matsufuji et al.

(10) Patent No.: US 7,542,367 B2
(45) Date of Patent: Jun. 2, 2009

(54) SEMICONDUCTOR MEMORY DEVICE

(75) Inventors: Kensuke Matsufuji, Fuchu (JP); Hiroshi Ito, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 111 days.

(21) Appl. No.: 11/839,199

(22) Filed: Aug. 15, 2007

(65) Prior Publication Data

US 2008/0049485 A1 Feb. 28, 2008

(30) Foreign Application Priority Data

Aug. 23, 2006 (JP) ............................. 2006-226289

(51) Int. Cl.
*G11C 17/18* (2006.01)
(52) U.S. Cl. .................... 365/225.7; 365/96
(58) Field of Classification Search ............. 365/225.7, 365/96, 189.09
See application file for complete search history.

(56) References Cited

U.S. PATENT DOCUMENTS

| | | | | |
|---|---|---|---|---|
| 5,909,398 | A * | 6/1999 | Tanzawa et al. | 365/185.29 |
| 6,108,246 | A * | 8/2000 | Umezawa et al. | 365/189.09 |
| 6,320,809 | B1 * | 11/2001 | Raad | 365/226 |
| 6,594,187 | B2 | 7/2003 | Ito | |
| 6,804,156 | B2 | 10/2004 | Ito | |
| 7,046,569 | B2 | 5/2006 | Ito et al. | |
| 7,257,012 | B2 | 8/2007 | Nakayama et al. | |
| 7,310,282 | B2 * | 12/2007 | Edelen et al. | 365/225.7 |
| 2006/0133127 | A1 | 6/2006 | Nakano et al. | |
| 2006/0158923 | A1 | 7/2006 | Namekawa et al. | |
| 2006/0193163 | A1 | 8/2006 | Ito | |
| 2007/0070693 | A1 | 3/2007 | Nakano et al. | |
| 2007/0103224 | A1 | 5/2007 | Namekawa et al. | |

OTHER PUBLICATIONS

U.S. Appl. No. 11/971,425, filed Jan. 9, 2008, Matsufuji et al.
U.S. Appl. No. 11/833,054, filed Aug. 2, 2007, Namekawa et al.
U.S. Appl. No. 11/738,774, filed Apr. 23, 2007, Nakano et al.
U.S. Appl. No. 11/733,933, filed Apr. 11, 2007, Namekawa et al.
U.S. Appl. No. 12/138,005, filed Jun. 12, 2008, Namekawa et al.
U.S. Appl. No. 12/140,071, filed Jun. 16, 2008, Matsufuji et al.

* cited by examiner

*Primary Examiner*—Anh Phung
(74) *Attorney, Agent, or Firm*—Oblon, Spivak, McClelland, Maier & Neustadt, P.C.

(57) ABSTRACT

A write voltage source is capable of applying a write voltage, which is a high voltage. An antifuse is connected at one end to the write voltage source and has a resistance irreversibly variable based on the write voltage. A sense node is connectable to the other end of the antifuse. A sense amp compares the potential on the sense node with a reference potential. The sense node is used to accumulate charge thereon. To control the potential difference placed between both ends of the antifuse, a third transistor is provided having one end connected to the sense node. The third transistor is provided with a precharge voltage source on the other end, and a precharge controller operative to on/off control the gate.

11 Claims, 2 Drawing Sheets

SEMICONDUCTOR MEMORY DEVICE

CROSS-REFERENCE TO RELATED APPLICATION

This application is based upon and claims the benefit of priority from the prior Japanese Patent Application No. 2006-226289, filed on Aug. 23, 2006, the entire contents of which are incorporated herein by reference.

BACKGROUND OF THE INVENTION

1. Field of the Invention

The present invention relates to a semiconductor memory device including electrically programmable irreversible memory elements.

2. Description of the Related Art

A semiconductor integrated circuit absolutely requires non-volatile OTP (One Time Programmable) memories that can continuously hold stored information after power off. They have been widely employed for redundancy use in massive memories such as DRAM and SRAM, for tuning use in analogue circuits, for code storage use in encryption keys, and for use of storing production histories.

Conventional memory redundancy utilizes a ROM that uses laser fuses (see JP-A 2001-168196). The laser fuse ROM includes an ordinary wire, which is blown out with laser light to store information. Therefore, it requires no particular processes to form laser fuses and has been considered a cheapest non-volatile memory. The laser fuse ROM, however, requires a particular fuse blower and the blowing step using the same and accordingly has a weakness associated with a higher programming cost. In addition, the minimum dimension of the laser fuse is determined by the wavelength of the laser light used. Accordingly, it can not keep pace with fine patterning of other circuit parts and causes a problem associated with the share of the area that gradually increases. Further, as programming is executed using laser, programming can not be executed except for only in a wafer state and can not be used to relieve a failure found in a fast test after packaging. Therefore, using no laser blower increases the expectation of application to an electrically programmable non-volatile OTP memory.

There has been an electrically programmable non-volatile OTP memory that uses an antifuse. The antifuse is a MOSFET including a thin gate oxide, to which gate oxide a high voltage is applied to break down the insulator to store information. The programming mechanism for the antifuse is extremely simple because it is sufficient to place a large potential difference between both ends of the antifuse on programming data. Thus, the antifuse is a memory element that is most expected for use in the non-volatile OTP memory in the future.

There is a problem, however, to be solved on boosting the write voltage. The antifuse has one end connected to a write power source, and the other end connected to a write and a read circuit. Therefore, on boosting the write voltage, only the voltage on the one end is boosted while the other end still remains at a low voltage. As a result, a high voltage is applied across the gate oxide of the antifuse to break down the insulator and cause false write possibly.

SUMMARY OF THE INVENTION

In an aspect the present invention provides a semiconductor memory device, comprising: a write voltage source capable of applying a write voltage; an antifuse connected to the write voltage source and having one end supplied with the write voltage; a first transistor having one end connected to the other end of the antifuse; a first transistor controller configured to provide a first gate signal to the gate of the first transistor to controllably turn on/off the first transistor; a second transistor having one end connected to the other end of the first transistor and having the other end grounded; a second transistor controller configured to provide a second gate signal to the gate of the second transistor to controllably turn on/off the second transistor; a sense node having one end connected to the other end of the first transistor; a sense amp connected to the sense node and configured to compare the potential on the sense node with a reference potential; and a potential difference controller configured to accumulate charge on the sense node to control the potential difference placed between both ends of the antifuse.

DETAILED DESCRIPTION OF THE EMBODIMENTS

The embodiments of the present invention will now be described below with reference to the drawings.

First Embodiment

Figure 1:
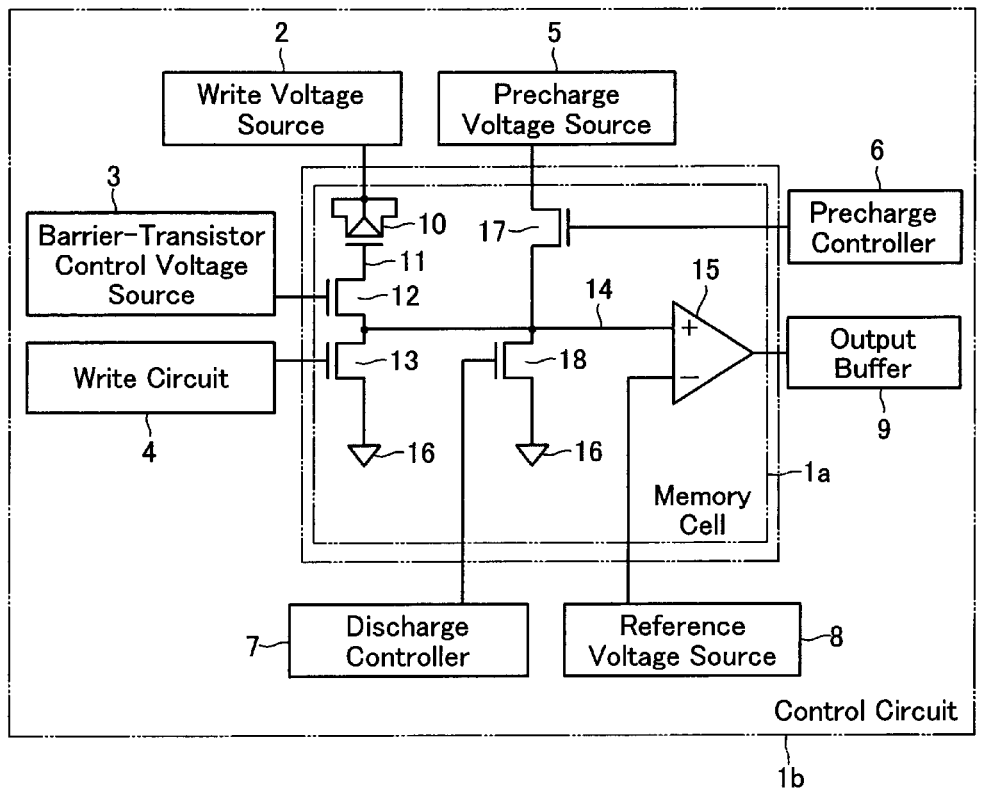
FIG. 1 is a brief block diagram of a non-volatile semiconductor device according to a first embodiment of the present invention.
Figure 2:
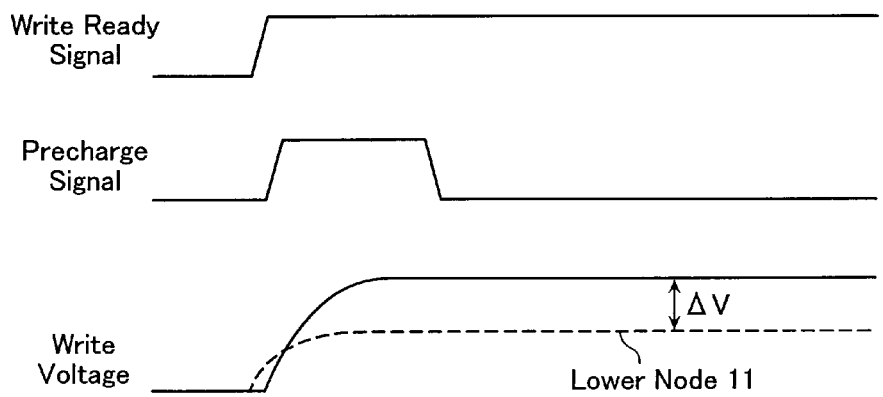
FIG. 2 is an operational timing chart of the non-volatile semiconductor device according to the first embodiment of the present invention.

With reference to FIGS. 1 and 2, a non-volatile semiconductor memory device according to a first embodiment of the present invention is described.

(Configuration of Non-volatile Semiconductor Memory Device of First Embodiment)

Referring first to FIG. 1, a brief configuration of the non-volatile semiconductor memory device according to the first embodiment is described. FIG. 1 is a brief block diagram of the non-volatile semiconductor memory device according to the first embodiment of the present invention.

As shown in FIG. 1, the semiconductor memory device comprises a memory cell 1a provided to store information, and a control circuit 1b arranged to control the memory cell 1a. The semiconductor memory device comprises an antifuse 10 provided inside the memory cell 1a. A number of such memory cells 1a are arranged, for example, in matrix to form a non-volatile OTP memory. For example, the antifuse 10 is a MOSFET gate insulator. The semiconductor memory device is configured to apply a high voltage across the antifuse 10 to break down the gate insulator, thereby changing the resistance of the gate insulator irreversibly to write information.

In the memory cell 1a, the antifuse 10 has one end connected to a write voltage source 2, and the other end connected to a lower node (first node) 11. The lower node 11 is connected to one end (drain) of a first n-type MOS transistor 12. The first n-type MOS transistor 12 has the other end (source) connected to one end (drain) of a second n-type MOS transistor 13 and to one end of a sense node 14. The sense node 14 has the other end connected to an input terminal of a sense amp 15. The second n-type MOS transistor 13 has the other end (source) connected to a ground terminal 16. The sense node 14 is connected to one end (source) of a third n-type MOS transistor 17 and to one end (drain) of an n-type MOS transistor 18 with the other end connected to the ground terminal 16.

As detailed later, the first n-type MOS transistor 12 has a function of protecting the sense amp 15 from a higher voltage than a certain threshold. This voltage is output from the write voltage source 2 as described later if information is written in the antifuse 10, that is, when the antifuse 10 is brought into conduction.

The second n-type MOS transistor 13 serves as a write control transistor that grounds one end of the lower node 11 and applies a high voltage to the antifuse 10 to bring the antifuse 10 into written state.

The third n-type MOS transistor 17 serves as a precharge control transistor that allows accumulation of charge on the sense node 14.

The n-type MOS transistor 18 serves as a ground transistor that grounds the sense node 14 and allows discharge of the charge accumulated on the sense node 14.

The control circuit 1b is configured as described below. The other end of the antifuse 10 is connected to the write voltage source 2 capable of applying a high voltage (write voltage) that can break down the antifuse 10. The write voltage source 2 is shared by a plurality of memory cells 1a.

The first n-type MOS transistor 12 has a gate provided with a barrier-transistor control voltage source 3 operative to control whether or not the lower node 11 is connected to the sense node 14.

The second n-type MOS transistor 13 has a gate provided with a write circuit 4 operative to ground the voltage on the lower node 11 to control application of the write voltage.

The third n-type MOS transistor 17 has a drain provided with a precharge voltage source 5 capable of applying a voltage (precharge voltage) near the write voltage, with providing a gate signal. The third n-type MOS transistor 17 has a gate provided with a precharge controller 6 operative to provide a gate signal to control whether or not the precharge voltage is applied to the sense node 14.

The n-type MOS transistor 18 has a gate provided with a discharge controller 7 operative to provide a gate signal to control whether or not the voltage on the sense node 14 is grounded (discharged).

The sense amp 15 has another input terminal provided with a reference voltage source 8 operative to apply a reference voltage to the sense amp 15. The sense amp 15 has an output provided with an output buffer for buffering the output voltage.

(Write Voltage Boosting in Semiconductor Memory Device of First Embodiment)

Referring next to FIG. 2, write-voltage boosting in the semiconductor memory device according to the first embodiment is described. FIG. 2 is an operational timing chart of the non-volatile semiconductor device according to the first embodiment of the present invention. The write voltage source 2 is shared by all the memory cells 1a. Accordingly, the write voltage source 2 supplies the write voltage to the antifuse 10 even in the memory cell 1a not selected for writing.

First, the semiconductor memory device receives a write ready signal at the precharge voltage source 5 during the initial state of boosting the voltage in the write voltage source 2. Then, the precharge voltage source 5 provides a precharge voltage of, for example, 2.5V. Subsequently, the precharge controller 6 provides a gate signal (precharge signal) of a sufficient voltage, for example, 2.5 V to turn on the third n-type MOS transistor 17.

The third n-type MOS transistor 17 on receipt of the precharge signal is turned on to connect the precharge voltage source 5 with the sense node 14 to raise the potential on the sense node 14. At the same time, the barrier-transistor control voltage source 3 starts to boost the voltage toward, for example, 3V. When the voltage boosted at the barrier-transistor control voltage source 3 reaches a certain voltage, for example, 3 V, the first n-type MOS transistor 12 is turned on to connect the sense node 14 with the lower node 11 to raise the potential on the lower node 11.

At this time, the raised potential on the lower node 11 reaches a sufficient potential to relieve the potential difference between both ends of the antifuse 10. Finally, the output voltage from the write voltage source 2 is boosted up to a write voltage of, for example, 7 V required to break down the gate insulator of the antifuse 10. This operation suppresses the potential difference $\Delta V$ between the write voltage generated at the write voltage source 2 and the lower node 11 and prevents false write due to breakdown of the antifuse 10.

At this time, a high voltage near the voltage generated at the write voltage source 2 is applied to one end of the first n-type MOS transistor 12. Therefore, protection of the sense amp 15 and the first n-type MOS transistor 12 itself requires the potential on the gate of the first n-type MOS transistor 12 to have a middle potential between the potential generated at the write voltage source 2 and the ground. For example, 3 V is appropriate.

(Writing in Semiconductor Memory Device of First Embodiment)

Referring next to FIG. 2, writing in the semiconductor memory device according to the first embodiment is described. After completion of boosting the voltage in the write voltage source 2, the write circuit 4 first provides a gate signal of a sufficient voltage, for example, 1.5 V to turn on the second n-type MOS transistor 13. The gate signal from the write circuit 4 turns on the second n-type MOS transistor 13, which connects the sense node 14 with the ground terminal 16. The sense node 14 reaches the GND level and the potential on the lower node 11 also lowers. This causes a large potential difference between both ends of the antifuse 10, which breaks down the gate insulator configuring the antifuse 10 to write information. In such the state after the gate insulator configuring the antifuse 10 is broken down, the antifuse 10 is conducting to electrically connect the write voltage source 2 with the lower node 11.

(Reading in Semiconductor Memory Device)

Reading in the semiconductor memory device of the first embodiment is described next. First, the barrier-transistor control voltage source 3 boosts the voltage up to a sufficient voltage, for example, 3V to turn on the first n-type MOS transistor 12, and provides a gate signal output. Accordingly, the first n-type MOS transistor 12 turns on and connects the lower node 11 with the sense node 14. Subsequently, the write voltage source 2 provides a voltage of such the extent that can not break down the gate insulator configuring the antifuse 10. For example, it is 1.5 V. Accordingly, in the written memory cell 1a, the potential on the sense node 14 rises. On the other hand, in non-written memory cells 1a, the potential on the sense node 14 can not rise.

The discharge controller 7 boosts the voltage up to a sufficient voltage, for example, 1.5 V to turn on the n-type MOS transistor 18, and provides a gate signal output. Accordingly, the sense node 14 is connected to the ground terminal 16 and reaches the GND level. Thereafter, the discharge controller 7 lowers the voltage to turn off the n-type MOS transistor 18, which disconnects the sense node 14 from the ground terminal 16. Then, in the written memory cell 1a, the potential on the sense node 14 rises. On the other hand, in non-written memory cells 1a, the potential on the sense node 14 can not rise. Subsequently, the reference voltage source 8 boosts the reference voltage up to, for example, 0.5 V. Finally, the sense amp 15 provides a high-voltage signal regarding the written memory cell 1a and a low-voltage signal regarding non-written memory cells 1a to the output buffer 9.

Standing on the above function of the semiconductor memory device according to the first embodiment, the above-described configuration is described in another way. Namely, the third n-type MOS transistor 17, the precharge voltage source 5 and the precharge controller 6 together serve as a potential difference controller operative to accumulate charge on the sense node 14 to control the potential difference placed between both ends of the antifuse 10.

Thus, the first embodiment of the present invention is able to prevent false write of information, on generation of a high voltage for writing information in the antifuse 10, by relieving a large potential difference placed between both ends of the memory element. Complementary executions of writing operation and memory element protection can increase the accuracy of protecting false write of information. Namely, the first embodiment makes it possible to manufacture a reliable semiconductor memory device.

The above semiconductor memory device according to the first embodiment is configured to generate voltages and control signals at respective voltage sources and controllers (denoted with the reference numerals 2-8). The present invention is not limited to such the configuration but rather may be configured such that the voltages and control signals are supplied from external power sources and circuits.

In the semiconductor memory device according to the first embodiment, the third n-type MOS transistors 17 may be replaced with p-type MOS transistors.

Second Embodiment

Figure 3:
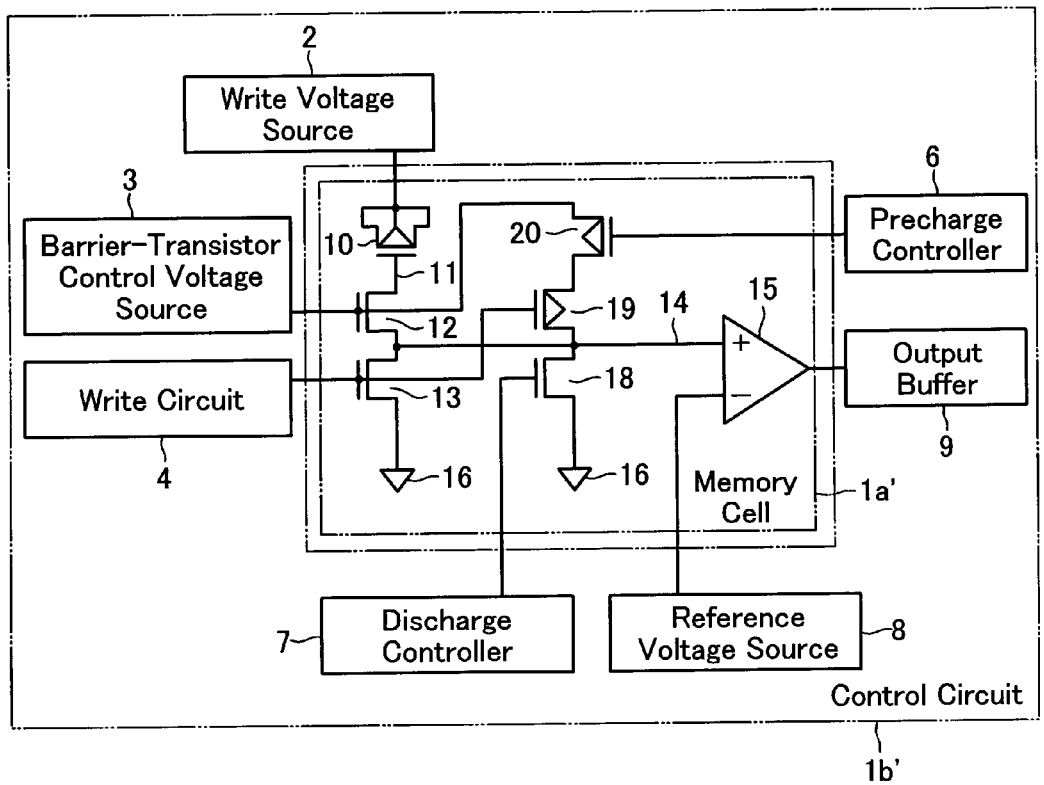
FIG. 3 is a brief block diagram of a non-volatile semiconductor device according to a second embodiment of the present invention.
Figure 4:
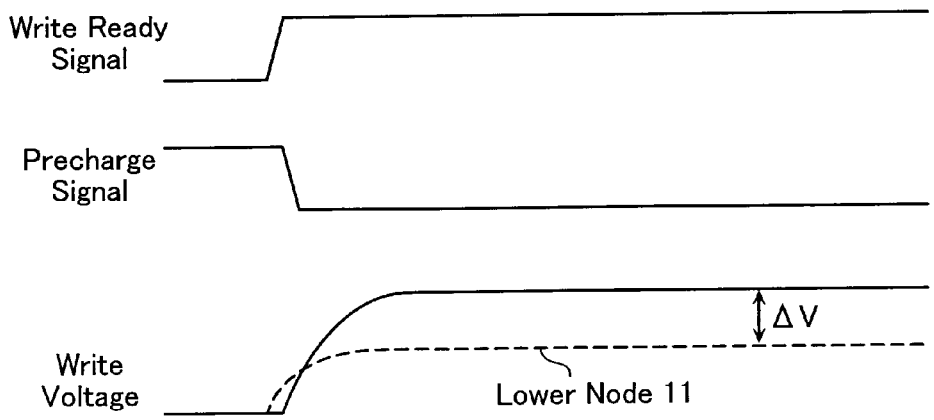
FIG. 4 is an operational timing chart of the non-volatile semiconductor device according to the second embodiment of the present invention.

With reference to FIGS. 3 and 4, a non-volatile semiconductor memory device according to a second embodiment of the present invention is described next.

(Configuration of Non-volatile Semiconductor Memory Device of Second Embodiment)

Referring first to FIG. 3, a brief configuration of the non-volatile semiconductor memory device according to the second embodiment is described. FIG. 3 is a brief block diagram of the non-volatile semiconductor memory device according to the second embodiment of the present invention.

As shown in FIG. 3, the semiconductor memory device comprises a memory cell 1a' provided to store information, and a control circuit 1b' arranged to control the memory cell 1a'. In the second embodiment the same parts as those in the first embodiment are denoted with the same reference numerals and omitted from the following description.

The memory cell 1a' is configured such that the third n-type MOS transistor 17 is omitted from the memory cell 1a of the first embodiment. Different from the first embodiment, the memory cell 1a' additionally includes a first p-type MOS transistor 19 having one end connected to the sense node 14, and a second p-type MOS transistor 20 having one end connected to the other end of the first p-type MOS transistor 19.

The above first p-type MOS transistor 19 serves as a first precharge control transistor operative to prevent application of the precharge voltage to the sense node 14 when the second n-type transistor 13 is kept on.

The second p-type MOS transistor 20 serves as a second precharge control transistor operative to allow the voltage from the barrier-transistor control voltage source 3, that is, the precharge voltage to be applied to the sense node 14.

The control circuit 1b' is configured such that the precharge voltage source 5 is omitted from the control circuit 1b of the first embodiment. Different from the first embodiment, in the control circuit 1b' the write circuit 4 is connected not only to the gate of the second n-type MOS transistor 13 but also to the gate of the first p-type MOS transistor 19. In addition, the barrier-transistor control voltage source 3 is connected not only to the gate of the first n-type MOS transistor 12 but also to the other end (source) of the second p-type MOS transistor 20. The precharge controller 6 is connected to the gate of the second p-type MOS transistor 20.

(Write Voltage Boosting in Semiconductor Memory Device of Second Embodiment)

Referring next to FIG. 4, write-voltage boosting in the semiconductor memory device according to the second embodiment is described. FIG. 4 is an operational timing chart of the non-volatile semiconductor device according to the second embodiment of the present invention. The write voltage source 2 is shared by all the memory cells 1a'. Accordingly, write voltage boosting is executed for the antifuse 10 even in the memory cell 1a' not selected for writing.

First, the semiconductor memory device receives a write ready signal at the barrier-transistor control voltage source 3. In accordance with the input of the write ready signal, the barrier-transistor control voltage source 3 starts to boost the voltage toward, for example, 3 V. When the voltage boosted at the barrier-transistor control voltage source 3 reaches a certain voltage, for example, 3 V, the first n-type MOS transistor 12 is turned on to connect the sense node 14 with the lower node 11. Then, the precharge controller 6 provides a gate signal (precharge signal) of a sufficiently low voltage, for example, 0 V to turn on the second p-type MOS transistor 20.

Accordingly, the second p-type MOS transistor 20 is turned on. In this case, the write circuit 4 does not generate the high voltage from the initial state and accordingly the first p-type MOS transistor 19 is kept on. Therefore, the barrier-transistor control voltage source 3 is connected to the sense node 14 to raise the potential on the sense node 14. The sense node 14 is also connected to the lower node 11 and accordingly the potential on the lower node 11 is raised. In this case, the raised potential on the lower node 11 reaches a sufficient voltage to relieve the potential difference between both ends of the antifuse 10.

Finally, the write voltage source 2 boosts the voltage up to a sufficient voltage, for example, 7 V to break down the gate insulator of the antifuse 10. This operation suppresses the potential difference $\Delta V$ between the write voltage output from the write voltage source 2 and the lower node 11 to prevent false write due to breakdown of the antifuse 10.

At this time, a high voltage near the voltage output from the write voltage source 2 is applied to one end of the first n-type MOS transistor 12. Therefore, protection of the sense amp 15 and the first n-type MOS transistor 12 itself requires the potential on the gate of the first n-type MOS transistor 12 to have an around middle potential between the potential generated at the write voltage source 2 and the ground. For example, 3 V is appropriate.

(Writing in Semiconductor Memory Device of Second Embodiment)

Writing in the semiconductor memory device according to the second embodiment is described next. After completion of boosting the write voltage, the write circuit 4 first boost the voltage up to a sufficient voltage, for example, 1.5 V to turn on the second n-type MOS transistor 13, and provides a gate signal output. Then, the second n-type MOS transistor 13 turns on and connects the sense node 14 with the ground terminal 16. Thus, the sense node 14 reaches the GND level and the potential on the lower node 11 also lowers.

This causes a large potential difference between both ends of the antifuse 10, which breaks down the gate insulator configuring the antifuse 10 to write information. In such the state after the gate insulator configuring the antifuse 10 is broken down, the antifuse 10 is conducting to electrically connect the write voltage source 2 with the lower node 11.

(Reading in Semiconductor Memory Device of Second Embodiment)

Reading in the semiconductor memory device according to the second embodiment is described next. In reading, the write circuit 4 always provides a low potential while the precharge controller 6 always provides a high potential. Initially, the barrier-transistor control voltage source 3 boosts the voltage up to a sufficient voltage, for example, 3 V to turn on the first n-type MOS transistor 12, and provides a gate signal output. In accordance with this gate signal, the first n-type MOS transistor 12 turns on and connects the lower node 11 with the sense node 14. Next, the write voltage source 2 provides a voltage of such the extent that can not break down the gate insulator configuring the antifuse 10. For example, it is 1.5 V.

Then, in the written memory cell 1a', the potential on the sense node 14 rises. On the other hand, in non-written memory cells 1a', the potential on the sense node 14 can not rise. Next, the discharge controller 7 boosts the voltage up to a sufficient voltage, for example, 1.5 V to turn on the n-type MOS transistor 18, and provides a gate signal output. Accordingly, the sense node 14 is connected to the ground terminal 16 and reaches the GND level. Thereafter, the discharge controller 7 lowers the voltage to turn off the n-type MOS transistor 18, which disconnects the sense node 14 from the ground terminal 16. Then, in the written memory cell 1a', the potential on the sense node 14 rises.

On the other hand, in non-written memory cells 1a', the potential on the sense node 14 can not rise. In addition, the reference voltage source 8 provides a reference voltage of, for example, 0.5 V. Finally, when the sense amp 15 is activated, a high-potential signal regarding the written memory cell 1a' and a low-potential signal regarding non-written memory cells 1a' are fed to the output buffer 9.

Standing on the above function of the semiconductor memory device according to the second embodiment, the above-described configuration is described in another way. Namely, the first p-type MOS transistor 19, the second p-type MOS transistor 20 and the precharge controller 6 together serve as a potential difference controller operative to accumulate charge on the sense node 14 to control the potential difference placed between both ends of the antifuse 10.

Thus, the second embodiment of the present invention is able to prevent false write of information, on generation of a high voltage for writing information in the memory element (antifuse 10), by relieving a large potential difference placed between both ends of the memory element. Complementary executions of writing operation and memory element protection can increase the accuracy of protecting false write of information. Namely, the second embodiment makes it possible to manufacture a reliable semiconductor memory device.

The above semiconductor memory device according to the second embodiment is configured to generate voltages and control signals at respective voltage sources and controllers (denoted with the reference numerals 2-4 and 6-8). The present invention is not limited to such the configuration but rather may be configured such that the voltages and control signals are supplied from external power sources and circuits.

What is claimed is:

1. A semiconductor memory device, comprising:
    a write voltage source capable of applying a write voltage;
    an antifuse connected to said write voltage source and having one end supplied with said write voltage;
    a first transistor having one end connected to the other end of said antifuse;
    a first transistor controller configured to provide a first gate signal to the gate of said first transistor to controllably turn on/off said first transistor;
    a second transistor having one end connected to the other end of said first transistor and having the other end grounded;
    a second transistor controller configured to provide a second gate signal to the gate of said second transistor to controllably turn on/off said second transistor;
    a sense node having one end connected to the other end of said first transistor;
    a sense amp connected to said sense node and configured to compare the potential on said sense node with a reference potential; and
    a potential difference controller configured to accumulate charge on said sense node to control the potential difference placed between both ends of said antifuse.

2. The semiconductor memory device according to claim 1, further comprising:
    a ground transistor having one end connected to said sense node and having the other end grounded; and
    a discharge controller configured to provide a third gate signal to the gate of said ground transistor to controllably turn on/off said ground transistor and control discharge of the charge accumulated on said sense node.

3. The semiconductor memory device according to claim 1, said potential difference controller including
    a third transistor having one end connected to said sense node,
    a precharge voltage source connected to the other end of said third transistor and configured to supply charge to be accumulated on said sense node, and
    a precharge controller configured to provide a fourth gate signal to the gate of said third transistor to controllably turn on/off said third transistor.

4. The semiconductor memory device according to claim 3, wherein said precharge controller is configured to controllably turn on said third transistor when said write voltage is boosted.

5. The semiconductor memory device according to claim 3, further comprising:
    a ground transistor having one end connected to said sense node and having the other end grounded; and
    a discharge controller configured to provide a third gate signal to the gate of said ground transistor to controllably turn on/off said ground transistor and control discharge of the charge accumulated on said sense node.

6. The semiconductor memory device according to claim 1, said potential difference controller including
    a fourth transistor having one end connected to said sense node and having a gate connected to said second transistor controller,
    a fifth transistor having one end connected to the other end of said fourth transistor and having the other end connected to said first transistor controller, and
    a precharge controller configured to provide a fifth gate signal to the gate of said fifth transistor to controllably turn on/off said fifth transistor.

7. The semiconductor memory device according to claim 6, wherein said second transistor controller is configured to controllably turn on said fourth transistor when said write voltage is boosted,
    wherein said precharge controller is configured to controllably turn on said fifth transistor when said write voltage is boosted.

8. The semiconductor memory device according to claim 6, further comprising:
    a ground transistor having one end connected to said sense node and having the other end grounded; and
    a discharge controller configured to provide a third gate signal to the gate of said ground transistor to controllably turn on/off said ground transistor and control discharge of the charge accumulated on said sense node.

9. The semiconductor memory device according to claim 1, wherein said antifuse is a MOSFET gate insulator.

10. The semiconductor memory device according to claim 1, further comprising a reference voltage source configured to apply said reference potential to said sense amp.

11. The semiconductor memory device according to claim 1, further comprising an output buffer for buffering the output voltage from said sense amp.

* * * * *